(12) United States Patent
Kabany et al.

(10) Patent No.: US 11,293,971 B2
(45) Date of Patent: Apr. 5, 2022

(54) DIAGNOSIS OF A CONTROL DEVICE

(71) Applicant: ZF Friedrichshafen AG, Friedrichshafen (DE)

(72) Inventors: Mohammad Kabany, Regensburg (DE); Thomas Maier, Neunburg v. Wald (DE)

(73) Assignee: ZF Friedrichshafen AG, Friedrichshafen (DE)

(*) Notice: Subject to any disclaimer, the term of this patent is extended or adjusted under 35 U.S.C. 154(b) by 0 days.

(21) Appl. No.: 15/764,948

(22) PCT Filed: Aug. 30, 2016

(86) PCT No.: PCT/EP2016/070344
§ 371 (c)(1),
(2) Date: Mar. 30, 2018

(87) PCT Pub. No.: WO2017/054994
PCT Pub. Date: Apr. 6, 2017

(65) Prior Publication Data
US 2018/0284183 A1    Oct. 4, 2018

(30) Foreign Application Priority Data
Sep. 30, 2015   (DE) .......................... 102015218959.7

(51) Int. Cl.
*G01R 31/28* (2006.01)
*H05K 5/00* (2006.01)
(Continued)

(52) U.S. Cl.
CPC ..... *G01R 31/2844* (2013.01); *F16H 61/0006* (2013.01); *H05K 5/0082* (2013.01); *H05K 5/03* (2013.01); *G05B 2219/2637* (2013.01)

(58) Field of Classification Search
CPC .. F61H 61/00; F61H 61/0003; F61H 61/0006; H05K 5/00; H05K 5/0026;
(Continued)

(56) References Cited

U.S. PATENT DOCUMENTS 5,426,568 A * 6/1995 Lamers ................ H05K 3/0058
361/810
5,513,878 A * 5/1996 Ueda .................. B60R 21/0132
280/735
(Continued)

FOREIGN PATENT DOCUMENTS

DE   10 2005 043 557 A1   9/2006
DE   10 2006 011 726 A1   9/2007
(Continued)

OTHER PUBLICATIONS

International Search Report and Written Opinion of the International Search Authority dated Oct. 26, 2016 in International Application No. PCT/EP2016/070344 (English and German languages) (11 pp.).

(Continued)

*Primary Examiner* — Huy Q Phan
*Assistant Examiner* — David B Frederiksen
(74) *Attorney, Agent, or Firm* — Crowell & Moring LLP

(57) ABSTRACT

A control unit comprises a processing device with an electrical connection; a diagnostic circuit, which is electrically connected to the connection; and a sheathing, which completely insulates the connection electrically. At the same time, the diagnostic circuit comprises an electrical interface and is configured to sample an electrical signal at the connection and provide the result via the interface.

20 Claims, 2 Drawing Sheets

(51) Int. Cl.
*H05K 5/03* (2006.01)
*F16H 61/00* (2006.01)

(58) Field of Classification Search
CPC ........ H05K 5/0082; H05K 5/03; G01R 31/28; G01R 31/2832; G01R 31/2836; G01R 31/2844
See application file for complete search history.

(56) References Cited

U.S. PATENT DOCUMENTS

| | | | | |
|---|---|---|---|---|
| 5,923,959 | A * | 7/1999 | Mess | B29C 45/14655 257/E21.504 |
| 6,117,382 | A * | 9/2000 | Thummel | B29C 45/14655 257/E21.504 |
| 7,347,737 | B2 * | 3/2008 | Horiba | H01R 13/6477 439/676 |
| 8,581,421 | B2 * | 11/2013 | Shimizu | H01L 24/19 257/784 |
| 9,922,932 | B2 * | 3/2018 | Kawai | H01L 24/48 |
| 2001/0044171 | A1 * | 11/2001 | Mess | H01L 21/565 438/127 |
| 2002/0089052 | A1 * | 7/2002 | Yamaura | H01L 23/29 257/690 |
| 2003/0029920 | A1 * | 2/2003 | Chhor | G06K 19/07745 235/492 |
| 2004/0210805 | A1 | 10/2004 | Kimelman et al. | |
| 2008/0276454 | A1 * | 11/2008 | Weekamp | B01L 3/502707 29/829 |
| 2010/0041261 | A1 * | 2/2010 | Johnson | H01R 13/501 439/174 |
| 2010/0326177 | A1 * | 12/2010 | Kamm | F02D 41/22 73/114.71 |
| 2013/0258615 | A1 * | 10/2013 | Grauf | H01L 21/565 361/748 |
| 2013/0302947 | A1 * | 11/2013 | Tao | H01L 24/20 438/118 |
| 2014/0070381 | A1 * | 3/2014 | Doi | H01L 23/49558 257/666 |
| 2014/0126161 | A1 * | 5/2014 | Chen | H01L 25/16 361/748 |
| 2014/0177181 | A1 * | 6/2014 | Malek | H05K 9/003 361/749 |
| 2015/0017819 | A1 * | 1/2015 | Bolotin | H01R 43/18 439/31 |
| 2016/0150632 | A1 * | 5/2016 | Viswanathan | H05K 3/284 361/761 |

FOREIGN PATENT DOCUMENTS

| | | |
|---|---|---|
| DE | 603 14 915 T2 | 3/2008 |
| DE | 10 2007 031 110 A1 | 1/2009 |
| DE | 10 2010 042 019 A1 | 4/2012 |
| DE | 10 2013 215 365 | 2/2015 |

OTHER PUBLICATIONS

Search Report dated Mar. 21, 2016 for German Patent Application No. 10 2015 218 959.7, (10 pp.), note: pp. 1 and 2 are English language Explanations to Section C. Result of Determination Document.

* cited by examiner

US 11,293,971 B2

DIAGNOSIS OF A CONTROL DEVICE

CROSS REFERENCE TO RELATED APPLICATIONS

This application is a filing under 35 U.S.C. § 371 of International Patent Application PCT/EP2016/070344, filed Aug. 30, 2016, and claims the priority of German Patent Application 10 2015 218959.7, filed Sep. 30, 2015. All applications listed in this paragraph are herein incorporated by reference in their entireties.

TECHNICAL FIELD

The present invention relates to a control unit. In particular, the invention relates to the diagnostics of the control unit, for example, in the case of an error.

BACKGROUND

A control unit comprises a processing device and optionally further electric components to enable the control of a predefined device. For example, the control unit can be configured to control a gearbox, which is provided in a power train of a motor vehicle, or a different mechanical or electric component in the motor. Usually, the gearbox comprises multiple actuators and sensors, and the control unit is configured to scan the sensors and control the actuators, for example, to control the change of an engaged gear stage.

In spite of strict development and production guidelines, it is possible that the control unit may get into a fault condition that can interfere with the operation of the gear unit. The fault can occur mechanically, electrically or due to a program error. To prevent the error from occurring in another structurally identical control unit, it can be tried to make a detailed analysis of the cause of the error. In particular, an interface can be provided on the control unit via which internal states, values and parameters of the control unit can be read, especially by means of an external diagnostic device.

BRIEF SUMMARY

The exemplary control unit for the gearbox is configured to be integrated with the gearbox, i. e., mounted on or enclosed in the housing of the gearbox. In this case, the control unit is exposed the vibrations, temperature and possibly the lubricant provided in the gearbox. This integration can be advantageous, for example, to connect a temperature or pressure sensor directly to the control unit, without having to lead a cable to the outside of the gearbox housing. To protect the control unit from such harsh environmental conditions, it is equipped with a sheathing that can be configured, for example, in the form of an injection or casting compound, especially of a plastic material. A communication interface that penetrates the sheathing is not provided. In the event of an error, it may therefore be necessary to remove the sheathing completely to establish an electrical contact with an electrical connection inside the control unit, which may provide information about a condition of the control unit or the cause of an error.

It is the objective of the present embodiments to make a control unit available that provides improved diagnostic possibilities. According to present disclosure, this problem is solved by means of the control unit, which has the characteristics of the independent claim. Preferred embodiments are included in the sub-claims.

A control unit comprises a processing device with one or multiple electrical connections, a diagnostic circuit electrically connected to the connection, and a sheathing which completely insulates the connection electrically. At the same time, the diagnostic circuit comprises an electrical interface and is configured to sample one or multiple electrical signals at one or multiple connections and provide the result via the interface. The processing device described below involves one or multiple electronic components which comprise, among other things, an electronic processing unit and a power supply and which are configured to receive or detect and process electrical signals.

The diagnostic circuit can be used to scan the connection if, for example, the processing device is unable to do this by itself due to an error or can no longer make the result available externally. In this case, especially a serious defect of the processing device can be diagnosed even better from the outside. Such an error can occur, for example, if a power supply or a clock generator of the processing device is defective.

It is especially preferred that the diagnostic circuit functions independently of the processing device. For this purpose, it is especially preferred that supply voltages and supply signals of the processing device and the diagnostic circuit are to the extent possible provided separately from each other. For example, it is possible to implement the stabilization of a supply voltage for the processing device or a reset generator separately from a corresponding preparation for the diagnostic circuit. In one embodiment, the supply voltage for the diagnostic circuit is not prepared at all.

Furthermore, it is preferred that the diagnostic circuit is configured to scan the connection in such a way that the processing device is unchanged in its function. In other words, the diagnostic circuit can function in completely transparent fashion for the processing device. Input and output signals of the processing device are scanned, but not changed, by the diagnostic circuit. As a result, the processing device can operate as if the diagnostic circuit was not present.

In one embodiment the sheathing comprises a plastic compound applied directly to the connection. For example, the plastic compound can comprise an epoxy, a polymer or a polyester and is usually applied to the entire control unit, after the remaining components are connected to each other, for example, by means of a circuit board or a punching grid or free wiring. The plastic compound can completely enclose the control unit. Usually only one or a few supply ports are provided, which break through the sheathing. For example, these supply ports are used to supply power to the processing device and are generally not directly connected to the electrical connection described above. In this case, it is not possible to scan the connection or a plurality of connections inside the control unit without removing the sheathing, which can make it particularly difficult to find or diagnose a fault in the control unit.

However, to remove the sheathing in several places or even completely, great effort is required, which involves the additional risk of damaging a component of the control unit by the removal. In this case, the diagnostic circuit can scan one or multiple predetermined connections, so that a complete or extensive removal of the sheathing is not required but, instead, it may be sufficient to contact an interface of the diagnostic circuit.

In an especially preferred embodiment, during normal operation of the control unit, the interface is enclosed by the sheathing. Thus, it is possible to effectively prevent access to the interface of the diagnostic circuit and the interface can be protected against environmental influences, especially a corrosive or conductive medium. Then, the interface can be selectively exposed to gain access to diagnostic information. Usually, the interface has a smaller number of connections than can be sampled by the diagnostic circuit inside the control unit. For example, the interface can have a serial configuration, which usually requires one to three or four ports. However, the number of connections of the processing device, which can be sampled by the diagnostic circuit, is in principle unlimited.

Advantageously, the sheathing in the interface area is arranged to be selectively removed. For example, to remove the sheathing only in the area of the interface or its connections, the interface may have large-area electrical contacts, so that when a part of the sheathing is removed in the area of the interface, the probability is increased that all connections of the interface are at least partially exposed. In a different embodiment, the interface or its connections can be located at a predetermined position of the control unit, preferably close to each other. Despite the sheathing, the area of the interface at the control unit can be determined from the outside with sufficient precision to selectively expose the connections, ideally by removing only one contiguous area. In another embodiment, the sheathing can have a marking in the area of the interface, for example a coloring, an imprint or a structure. A preferred method of removing the coating is thermal ablation, for example, by means of a laser. Therefore, heat-sensitive components of the control unit may be advantageously located outside the interface or its connections.

The diagnostic circuit can monitor different control unit connections, the analysis of which is particularly informative when communication with the processing device is no longer possible, for example, because the processing device is no longer operating at all or only to a limited extent.

In one embodiment, the diagnostic circuit comprises an analog-to-digital converter, to provide as a result a digital value for a current flowing through the connection or a voltage applied at the connection. Thus, especially an energy supply of the processing device can be easily monitored by the diagnostic circuit.

In a further embodiment, the connection comprises a clock input of the processing device, and the diagnostic circuit is configured to sample a clock frequency at the connection. In the process, the frequency, as well as the adherence to predetermined levels or signal types can be analyzed at the clock input. In this embodiment, the connection is usually connected to a clock generator for the processing device, the correct operation of which can be monitored in this way by the diagnostic circuit.

In another embodiment, the diagnostic circuit is configured to provide bi-directional communication with the processing device via the interface and the connection. Regardless of a possible further communication interface of the processing device, in this way it is also possible to access internal parameters of the processing device. For example, a diagnostic program can be started on the processing device, which helps to examine more closely the functionality of the control unit. At the same time, predetermined commands or programs of the processing device can be initiated from the outside. If another communication interface of the processing device is provided, certain requirements can preferably only be effected via the diagnostic circuit. As a result, an improved separation between function and diagnostics of the control unit or processing device.

Furthermore, it is preferred that the interface comprises a serial interface or a serial bus. As a result, the interface can be operated with only a few connections and therefore be easier contacted mechanically or electrically. However, in a different embodiment, it is also possible to provide a different interface, for example, a parallel interface.

BRIEF DESCRIPTION OF THE DRAWINGS

Subsequently, the present embodiments are described in more detail with reference to the enclosed figures, in which.

DETAILED DESCRIPTION

Figure 1:
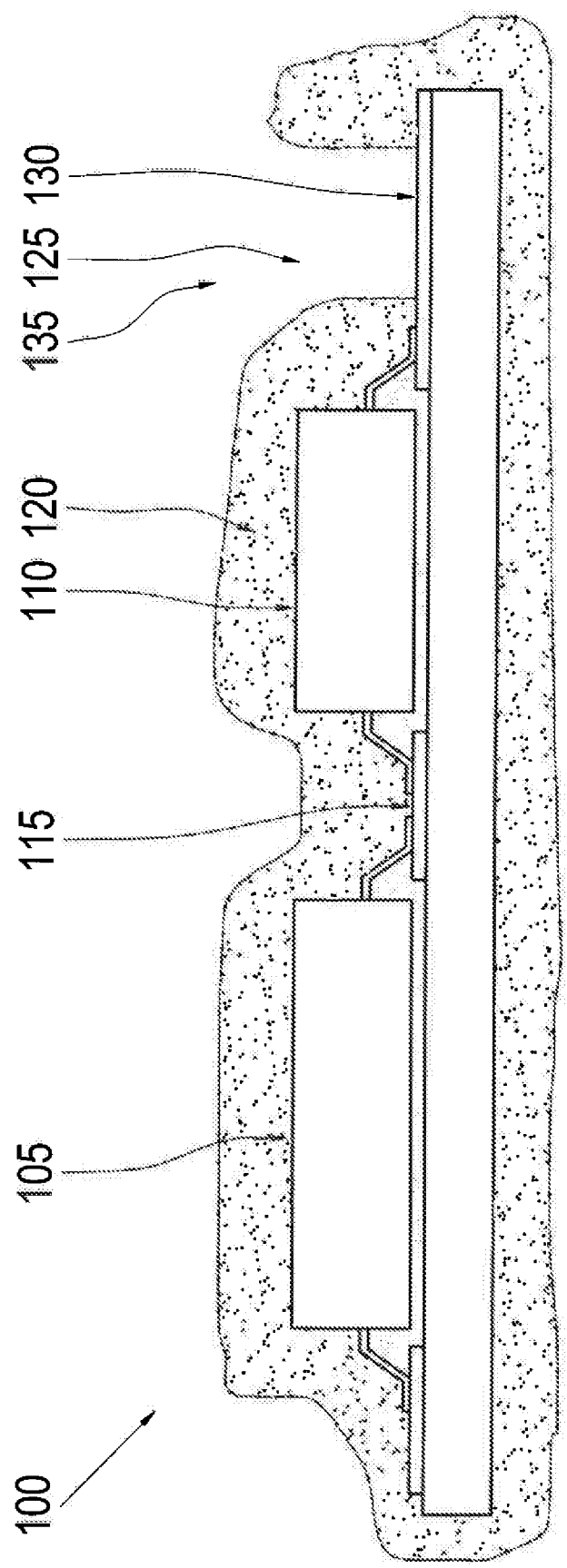
FIG. 1 shows a schematic view of an exemplary control unit.

FIG. 1 shows a schematic view of an exemplary control unit 100. The control unit 100 comprises a processing device 105 and a diagnostic circuit 110. A voltage supply for the processing device 105 is not shown. A voltage supply for the diagnostic circuit 110, which differs from the voltage supply for the processing device 105, is also not shown.

An electrical connection 115 of the processing device 105 is electrically connected to the diagnostic circuit 110. Furthermore, the control unit 100 has a sheathing 120, which especially comprises a plastic material that can be molded or injected and which is cured after application. In particular, the control unit 100 can be provided to be used under harsh environmental conditions, for example, in a vibration-rich environment or washed around by hot oil or any other medium. For example, such environmental conditions can be found inside a gearbox for a power train of a motor vehicle.

The diagnostic circuit 110 comprises an interface 125, which usually has one or multiple electrical connections 130. Preferably, the interface 125 is configured in the form of a serial interface or serial bus, so that only a few connections 130 are required, for example, between one and three. Preferably, the connections 130 are provided in a contiguous geometric range or area 135 of the control unit 100. In one embodiment, the sheathing 120 can be interrupted in area 135, so that the connection or connections 130 are exposed, or the sheathing 120 can be configured to be selectively removed in area 135, to expose the interface 125 or its connections 130.

In the preferred embodiment shown, the processing device 105 and the diagnostic circuit 110 are provided in the form of separately integrated circuits (integrated circuit, IC). In other embodiments, the processing device 105 and diagnostic circuit 110 may also be provided in a common housing, for example, in a multi-chip housing or as independent parts of a common integrated circuit. In particular, the diagnostic circuit 110 can be configured in a system base chip (SBC). Usually, a system base chip involves an electronic component, in which multiple functions required for implementing an electronic assembly are combined. These function groups can be in a not conclusive enumeration: voltage regulator, voltage monitoring, reset generator, watchdog, bus interface (CAN bus, LIN bus etc.), wakeup logic or power driver. However, it is also possible to use a different embodiment, especially in the form of a dedicated integrated circuit. In particular, the diagnostic circuit 110 can be implemented as a user-specific integrated circuit (ASIC) or as part of it.

Usually, the processing device 105 comprises a programmable microcomputer. Additional elements, such as a clock generator, a driver or a buffer can also be assigned to the processing device 105. Then, the microcomputer of the processing device 105 can be connected by means of the connection 115 especially to one of the external components.

Preferably, the diagnostic circuit 110 is configured to scan an electrical signal and provide the scanning result via the interface 125. It is usually intended that the scanning of the connection 115 will not interfere in any way with the function of the processing device 105. If necessary, used logic values can be converted accordingly, for example, active-high to active-low or vice versa, or an adaptation of the used voltage levels. This is referred to as adapting the levels across different power domains.

The diagnostic circuit 110 is configured to be as independent as possible of the processing device 105 to ensure that it can still function even if the processing device 105 is largely or completely out of function, for example, due to a defective power supply or a defective communication interface.

Figure 2:
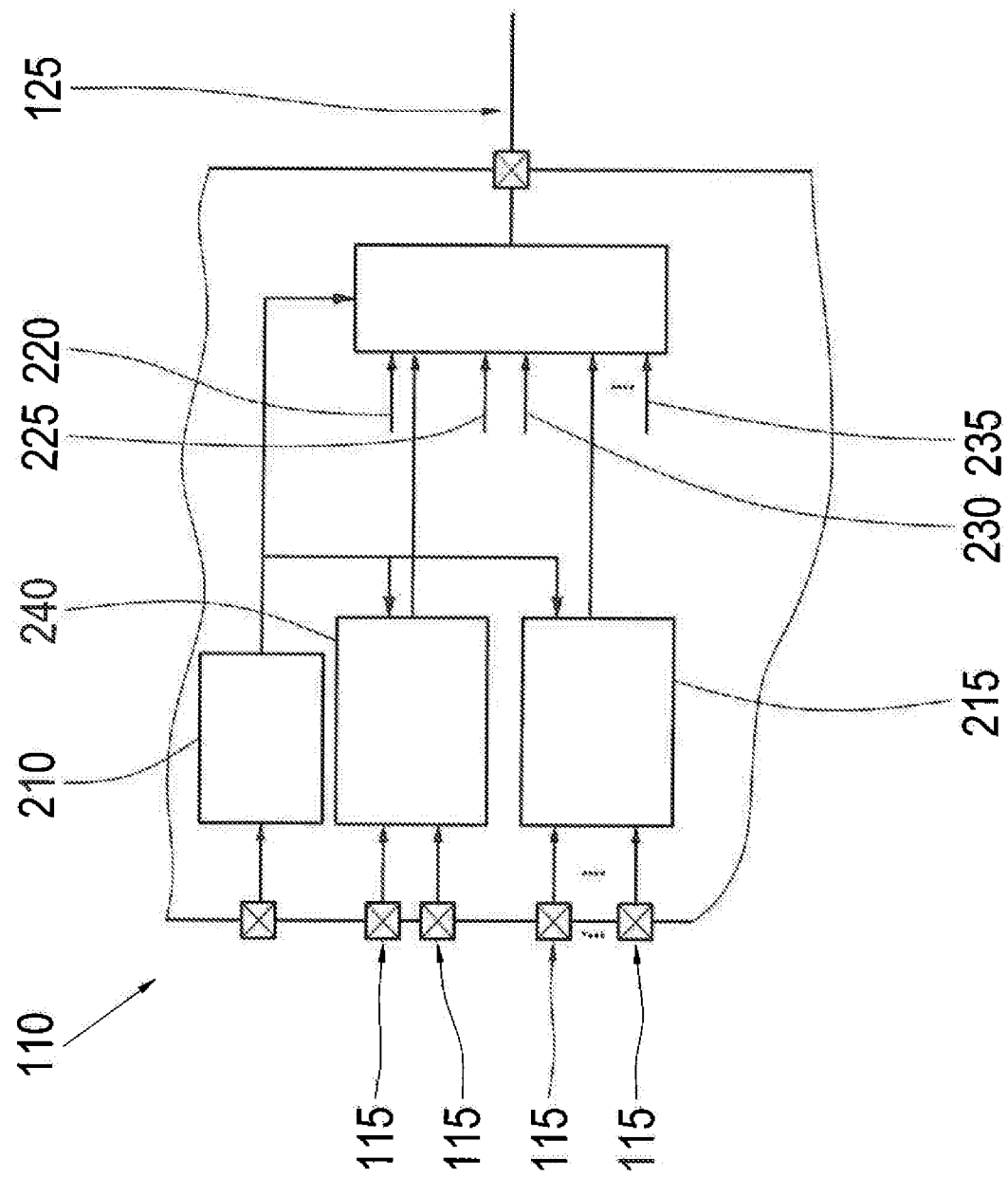
FIG. 2 displays a diagnostic circuit for the control unit shown in FIG. 1.

FIG. 2 displays a diagnostic circuit 110 for the control unit 100 shown in FIG. 1. The figure shows a possible exemplary embodiment, but it is also possible to use other embodiments.

Preferably, the diagnostic circuit 110 comprises an encoder 205, which controls the interface 125. For example, the encoder 205 can be configured in the form of parallel-serial converter, if the interface 125 has a serial configuration and the information is available in parallel form. In other embodiments, it is also possible to use a different converter as encoder 205, for example, in serial-parallel, parallel-parallel, or serial-serial configuration. At the same time, a pre-defined transmission protocol can be supported, such as RS232, USB, I2C or CAN. Preferably, a power supply of the encoder 205 is provided within the diagnostic circuit 110 and independent of the processing device 105. In particular, the power supply 210 can monitor voltage limits, raise or lower an input voltage to a predetermined voltage range, or perform other protective tasks, such as that of a reset generator. In one embodiment, no power supply 210 is provided for the diagnostic circuit 110. In the case of control unit 100 diagnostics, the function can be provided externally, for example, by an external diagnostic environment.

Preferably, the diagnostic circuit 110 also comprises an analog-to-digital converter 215, which can have one or multiple inputs, which can be connected to one or multiple connections 115 of the control unit 100 or processing device 105. In a further embodiment, one of the inputs of the analog-to-digital converters 215 can also be connected to a dedicated scanning device, which monitors a connection of the processing device 105. For example, this scanning device can comprise a current sensor or a frequency-to-voltage converter. Samples of the analog-to-digital converter 215 can, for example, be made available to the outside world successively via the encoder 205 at the interface 125.

In further embodiments, the encoder 205 can also scan additional internal data sources and provide the respective values at the interface 125. For example, it is possible to provide a voltage diagnostic vector 220, a current diagnostic vector 225, a register diagnostic vector 230 or another diagnostic vector 235 for transmission via the interface 125. In one embodiment, these vectors 220 to 235 can be taken over directly from the processing device 105. In one model, corresponding connections 115 are provided for this purpose, in another model, the processing device 105 and the diagnostic circuit 110 are integrated with each other in such a way that internal management statuses and intermediate results of the processing device 105 of the diagnostic circuit 110 are directly accessible.

Optionally, it is also possible to provide a trigger 240, which has one or multiple inputs and which activates and deactivates the function of the encoder 205 depending on the signals at its inputs. For example, the encoder 205 can be activated only when at least one predetermined result is scanned via one of the inputs. These occurrences can be sampled, for example, via a rising edge, a falling edge, a high or a low level at one of the inputs. In another embodiment, at least two occurrences must take place for the encoder 205 to be activated. The activation can be reset either in time-controlled or event-controlled manner.

REFERENCE NUMERALS 100 control unit
105 processing device
110 diagnostic circuit
115 connection
120 sheathing
125 interface
130 connection of the interface
135 area
205 encoder
210 voltage supply
215 analog-to-digital converter
220 voltage diagnostic vector
225 current diagnostic vector
230 register diagnostic vector
235 further diagnostic vectors
240 trigger

The invention claimed is:

1. A control unit, comprising:
a processing device located on a circuit board;
a diagnostic circuit located on the circuit board, wherein the diagnostic circuit is electrically connected to the processing device via an electrical connection; and
a sheathing, wherein the sheathing includes a molded material that substantially encompasses the processing device and the electrical connection such that it covers and electrically insulates the electrical connection,
wherein the sheathing substantially encompasses the circuit board such that it substantially covers a top surface and a bottom surface of the circuit board,
wherein the diagnostic circuit includes an electrical interface and is configured to sample an electrical signal at the electrical connection and provide the result through the electrical interface when the processing device is in a failure state where the processing cannot scan the electrical connection by itself and cannot send a result externally,
wherein the electrical interface is accessible via an opening through the molded material of the sheathing, and
wherein the circuit board consists of a single exposed area that is exposed at the opening through the molded material of the sheathing.

2. The control unit of claim 1, wherein the sheathing encompasses the portions of the diagnostic circuit other than the electrical interface.

3. The control device of claim 2, wherein the processing device and the diagnostic circuit are included in an integrated circuit.

4. The control device of claim 2, wherein the processing device and the diagnostic circuit are included in a system base chip.

5. The control device of claim 1, wherein the diagnostic circuit functions independently from the processing device.

6. The control device of claim 1, wherein the diagnostic circuit is configured to scan the electrical connection without altering input or output signals of the processing device.

7. The control device of claim 1, wherein the sheathing comprises a plastic compound applied directly to the electrical connection.

8. The control device of claim 1, wherein the interface is completely enclosed by the sheathing.

9. The control device of claim 8, wherein the sheathing is arranged to be selectively removed in the area of the interface.

10. The control device of claim 1, wherein the diagnostic circuit comprises an encoder that is connected to the interface, and wherein the encoder is configured to control the interface.

11. The control device of claim 10, wherein the diagnostic circuit comprises an analog-to-digital converter that is connected to the encoder, and wherein the analog-to-digital converter is configured to provide a digital value for at least one of a current and a voltage flowing through the electrical connection.

12. The control device of claim 10, wherein the diagnostic circuit comprises a trigger with one or more inputs, wherein the trigger is connected to the encoder, and wherein the trigger is configured to activate and/or deactivate the encoder based on a signal received by the one or more inputs.

13. The control unit of claim 10, wherein the encoder is configured to scan signals of at least one data source of the processing device and provide them to the interface.

14. The control device of claim 1, wherein the diagnostic circuit is configured to provide bi-directional communication with the processing device via the interface and the electrical connection.

15. The control device of claim 1, wherein the interface comprises at least one of a serial interface and a serial bus.

16. A method, the method comprising:
connecting a diagnostic circuit to a processing device via an electrical connection; and
applying a sheathing, wherein the sheathing includes a molded material that substantially encompasses the processing device and the electrical connection such that it covers and electrically insulates the electrical connection,
wherein the sheathing substantially encompasses the circuit board such that it substantially covers a top surface and a bottom surface of the circuit board,
wherein the diagnostic circuit includes an electrical interface and is configured to sample an electrical signal at the electrical connection and provide the result to the electrical interface when the processing device is in a failure state where the processing cannot scan the electrical connection by itself and cannot send a result externally, and
wherein the electrical interface is accessible via an opening through the molded material of the sheathing, and
wherein the circuit board consists of a single exposed area that is exposed at the opening through the molded material of the sheathing.

17. The method of claim 16, wherein the step of applying the sheathing occurs after the diagnostic circuit and the processing device are connected via the electrical connection.

18. The method of claim 17, wherein the sheathing includes at plastic compound with at least one of an epoxy, a polymer, and a polyester.

19. The method of claim 16, wherein the sheathing encompasses the portions of the diagnostic circuit other than the electrical interface.

20. The method of claim 16, wherein the diagnostic circuit functions independently from the processing device.

* * * * *